(12) United States Patent
Erhart et al.

(10) Patent No.: US 8,301,619 B2
(45) Date of Patent: Oct. 30, 2012

(54) SYSTEM AND METHOD FOR GENERATING QUERIES

(75) Inventors: George Erhart, Loveland, CO (US);
Valentine Matula, Granville, OH (US);
Arzucan Ozgur, Ann Arbor, MI (US);
David Skiba, Golden, CO (US)

(73) Assignee: Avaya Inc., Basking Ridge, NJ (US)

( * ) Notice: Subject to any disclaimer, the term of this patent is extended or adjusted under 35 U.S.C. 154(b) by 756 days.

(21) Appl. No.: 12/372,903

(22) Filed: Feb. 18, 2009

(65) Prior Publication Data

US 2010/0211569 A1 Aug. 19, 2010

(51) Int. Cl.
*G06F 7/00* (2006.01)
*G06F 17/30* (2006.01)

(52) U.S. Cl. ............ 707/713; 707/692; 707/769

(58) Field of Classification Search ......... 707/713, 707/769, 692
See application file for complete search history.

(56) References Cited

U.S. PATENT DOCUMENTS

| | | | |
|---|---|---|---|
| 5,526,443 A * | 6/1996 | Nakayama | 382/229 |
| 5,862,519 A | 1/1999 | Sharma et al. | |
| 6,026,388 A * | 2/2000 | Liddy et al. | 1/1 |
| 6,363,373 B1 * | 3/2002 | Steinkraus | 1/1 |
| 6,516,312 B1 * | 2/2003 | Kraft et al. | 707/610 |
| 7,028,250 B2 * | 4/2006 | Ukrainczyk et al. | 715/202 |
| 8,150,827 B2 * | 4/2012 | Kraftsow | 707/706 |
| 2002/0087579 A1 | 7/2002 | Chasanoff et al. | |
| 2003/0086409 A1 * | 5/2003 | Karas et al. | 370/350 |
| 2004/0068486 A1 * | 4/2004 | Chidlovskii | 707/3 |
| 2004/0243632 A1 * | 12/2004 | Beyer et al. | 707/104.1 |
| 2005/0283752 A1 | 12/2005 | Fruchter et al. | |
| 2006/0179051 A1 * | 8/2006 | Whitney et al. | 707/5 |
| 2007/0011151 A1 * | 1/2007 | Hagar et al. | 707/4 |
| 2007/0033003 A1 | 2/2007 | Morris | |
| 2007/0299838 A1 | 12/2007 | Behrens et al. | |
| 2008/0133479 A1 * | 6/2008 | Zelevinsky et al. | 707/3 |
| 2008/0243481 A1 * | 10/2008 | Brants et al. | 704/9 |
| 2009/0265171 A1 * | 10/2009 | Davis | 704/251 |
| 2010/0169300 A1 * | 7/2010 | Liu et al. | 707/709 |

\* cited by examiner

*Primary Examiner* — Wilson Lee
*Assistant Examiner* — Jessica N Le

(57) ABSTRACT

The system utilizes (gets) training data that comprises a plurality of training documents. Each of the plurality of training documents comprises a training token(s). The plurality of training documents are clustered into a plurality of clusters based on at least one training token in the plurality of training documents. Each cluster contains at least one training document. A Boolean query(s) is generated for a cluster based on an occurrence of the at least one training token in a training document in the plurality of training documents. The system gets production data that comprises a plurality of production documents. Each of the plurality of production documents comprises a production token(s). The Boolean query(s) is then executed on the production data.

41 Claims, 11 Drawing Sheets

|     | C1 500 | C2 501 | C3 502 |
| --- | --- | --- | --- |
| T1  | 50% | 0%  | 0%  |
| T2  | 30% | 0%  | 0%  |
| T3  | 20% | 50% | 0%  |
| T4  | 10% | 15% | 30% |
| T5  | 0%  | 0%  | 10% |

PERCENTAGE OF TRAINING DOCUMENTS THAT CONTAIN A TOKEN IN EACH CLUSTER

FIGURE 6

|     | C1 500 | C2 501 | C3 502 |
|-----|--------|--------|--------|
| T1  | .5     | 0      | 0      |
| T2  | .3     | 0      | 0      |
| T3  | .133   | .417   | 0      |
| T4  | .069   | .107   | .240   |
| T5  | 0      | 0      | .1     |

CALCULATED TOKEN/CLUSTER WEIGHT MATRIX

FIGURE 7

| C1 500 | C2 501 | C3 502 |
| --- | --- | --- |
| T1 (.5) | T3 (.284) | T4 (.133) |
| T2 (.3) | T5 (-.1) | T5 (.1) |
| T5 (-.1) | T4 (-.133) | T2 (-.3) |
| T4 (-.171) | T2 (-.3) | T3 (-.417) |
| T3 (-.284) | T1 (-.5) | T1 (-.5) |

RANKING OF TOKENS FOR EACH CLUSTER

FIGURE 8

SYSTEM AND METHOD FOR GENERATING QUERIES

TECHNICAL FIELD

The system and method relate to data clustering systems and in particular to generating Boolean queries based on clusters.

BACKGROUND

Currently, there are a variety of systems that can cluster data based on search terms. K-means and bisecting k-means are examples of algorithms that can be used to cluster data. These methods of clustering tend to be very processing intensive and are difficult to implement where there are rapid changes in the data set that is to be clustered. These clustering methods are not used to generate Boolean queries that can search a data set faster and with fewer processing resources than using existing clustering methods.

For example, U.S. Pat. No. 5,862,519 defines a system for "blind" clustering. The system takes data and segments the data into clusters. This system does not generate Boolean queries based on the clustered data and does not run the Boolean queries against a data set.

U.S. Patent Application Publication 2002/0087579 discloses a system for clustering data into classifications. The system then shows the relationships between data. The relationships can be various types of relationships, including Boolean relationships. However, this system does not generate any Boolean queries based on the clustered classifications. Moreover, the system does not run Boolean queries against the clustered classifications.

SUMMARY

The system and method are directed to solving these and other problems and disadvantages of the prior art. Each of a plurality of training documents comprises a training token(s). The plurality of training documents are clustered into a plurality of clusters based on at least one training token in the plurality of training documents. Each cluster contains at least one training document. A Boolean query(s) is generated for a cluster based on an occurrence of the at least one training token in a training document in the plurality of training documents. The system gets production data that comprises a plurality of production documents. Each of the plurality of production documents comprises a production token(s). The Boolean query(s) is then executed on the production data.

A further embodiment of the system gets the training data. The training data is cleaned. Salient token(s) are identified from the training token(s) in at least one of the plurality of training documents. The plurality of training documents are clustered into a plurality of clusters based on at least one training token or at least one salient token. Each cluster contains at least one training document. A Boolean query is generated for a cluster based on an occurrence of at least one salient token in a training document in the plurality of training documents. The system gets production data and executes the Boolean query on the production data.

BRIEF DESCRIPTION OF THE DRAWING

These and other features and advantages of the system and method will become more apparent from considering the following description of an illustrative embodiment of the system and method together with the drawing, in which:

FIG. 6 is a table that illustrates the percentage of training documents that contain a training token/salient token in each cluster.

FIG. 7 is a table that illustrates the calculated token/cluster weight matrix for each cluster.

FIG. 8 is a table that illustrates the ranking of tokens for each cluster.

DETAILED DESCRIPTION

Figure 1:
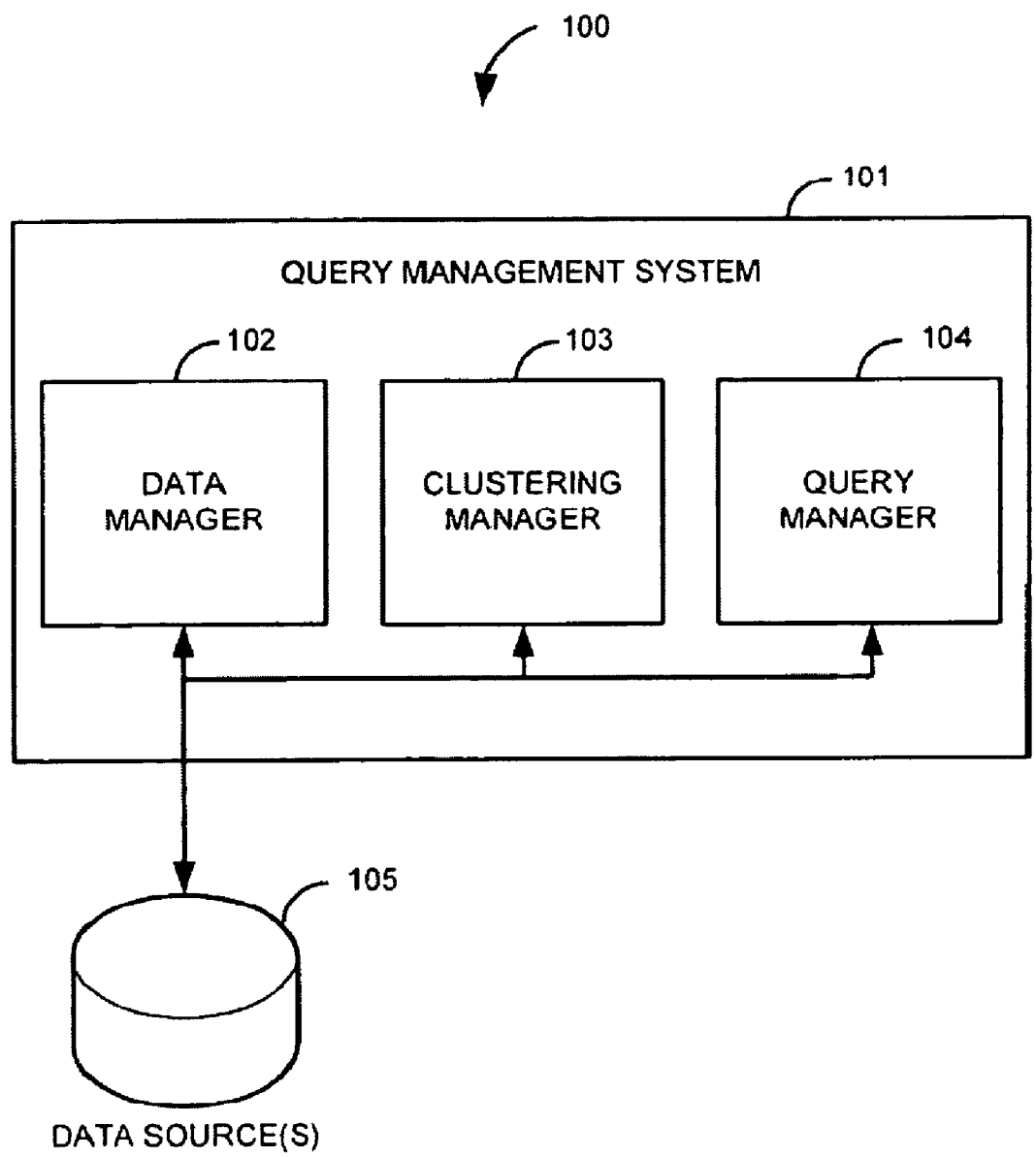
FIG. 1 is a block diagram of an illustrative system for generating and executing Boolean queries.

FIG. 1 is a block diagram of an illustrative system 100 for generating and executing Boolean queries. The system 100 comprises a query management system 101 and a data source (s) 105. The query management system 101 further comprises a data manager 102, a clustering manager 103, and a query manager 104.

The data source(s) 105 can be any type of system capable of generating and/or receiving data. The data source 105 can be a call center, an email system, a social network, a web site, a video server, a database, and the like. The query management system 101 can be any type of system capable of processing data such as a server, a Personal Computer (PC), a Private Branch Exchange (PBX), and the like. Likewise, the data manager 102, the clustering manager 103, and the query manager 104 can be any type of system(s) capable of processing data.

The data in the data source(s) 105 can contain training data and/or production data. Training data and/or production data can come from multiple data sources 105. Both the training data and the production data contain a plurality of documents. Each document of the plurality of documents in both the training data and the production data contains one or more tokens. The plurality of documents in both the training data and the production data can be any type of documents and/or information that can be compared such as emails, written documents, user input from a social network, video files, audio files, text transcripts of audio files, and the like. A document could be an individual email, groups of emails, a transcript of an individual call, a transcript of a group of calls, an entry in a social network, multiple entries in a social network, and the like.

Each document of both pluralities of training and production documents contains one or more tokens. A token can be any type of element that can be compared such as a text string, a unigram, a bi-gram, a trigram, identified video elements, identified audio elements, text strings generated from an audio file, and the like. For example, a token can be a video element, an identified video element, or any video object that may be identified and compared such as a car, a mountain, a person, and the like. Likewise, an audio element can be words from an audio file, a sound, and the like.

The data manager 102 gets training data from the data source(s) 105. The data manager 102 can get the training data from a single or multiple data sources 105. The training data contains a plurality of training documents. Each of the plurality of training documents contains at least one training token. The clustering manager 103 clusters the plurality of training documents into a plurality of clusters. The clustering can be based on a training token(s) in the plurality of training documents. For example, algorithms that can cluster documents based on token(s) include a k-means, a bisecting k-means, an agglomerative, or a divisive hierarchical clustering algorithm. A cluster contains at least one training document. A training document can be in more than one cluster.

The query manager 104 generates a Boolean query(s) for a cluster in the plurality of clusters based on an occurrence of the at least one training token in a clustered training document(s) in the cluster. The Boolean query(s) are generated for a cluster based on the occurrence or absence of the token in the plurality of training documents. The Boolean queries can be generated in a variety of ways such as a Disjunctive Normal Form (DNF) algorithm (see FIG. 9), an OR-BUT-NOT algorithm (see FIG. 10), and the like.

The data manager 102 gets production data from the data source(s) 105. The data manager 102 can get the production data from the same data source 105 as the training data or from a different data source 105. The production data may contain some or all of the training data. The data manager 102 can get the production data at any time, including before getting the training data. The production data contains a plurality of production documents. Each of the plurality of production documents contains at least one production token. The query manager then executes the Boolean query(s) on the plurality of production documents in the production data.

Boolean queries are executed on production tokens in the production data by determining if the token(s) in the Boolean query are in or not in the production documents. For example, if the generated Boolean query for Cluster 1 is Token 1 (the word "purchase") and Token 2 (the word "appliance"), the results of the Boolean query (purchase AND appliance) will only return production documents that contain the production tokens (words) purchase and appliance. Likewise, if the query is Token 1 and NOT token 2, the results of the Boolean query will return production documents that contain the production token purchase and do not contain the production token appliance. The production documents that are returned from the Boolean queries in this example are those that are most relevant to Cluster 1. This is because the queries are generated from the training token(s) in cluster 1.

Figure 2:
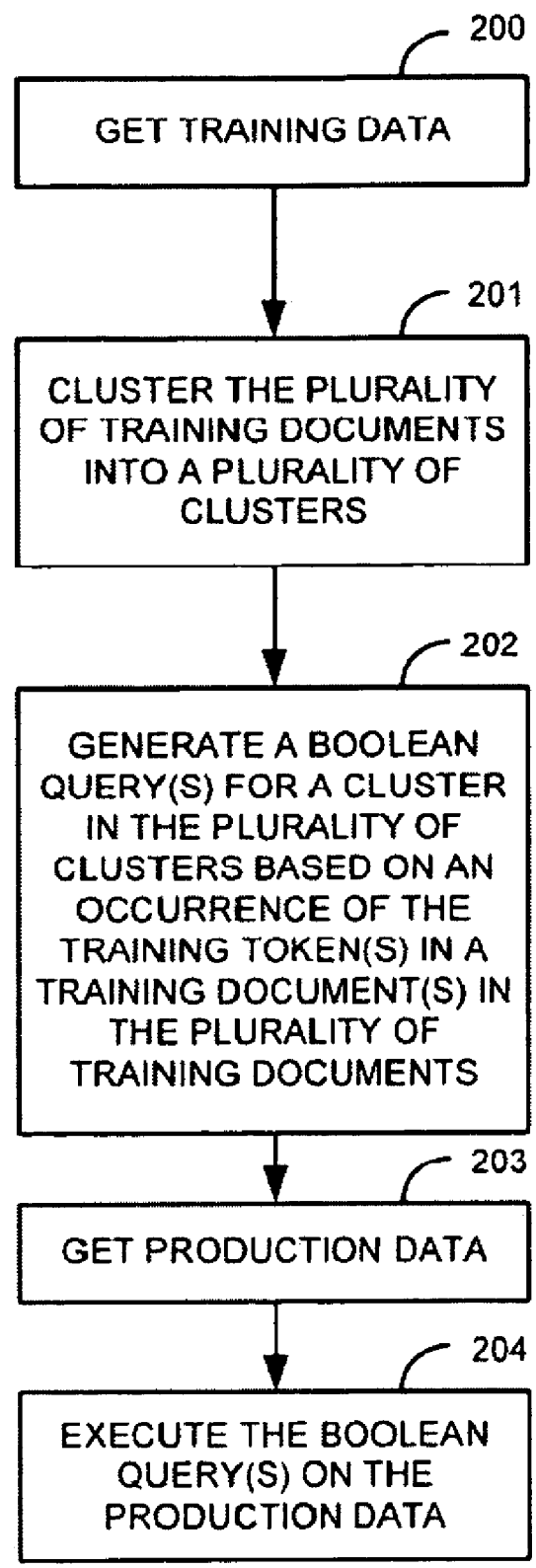
FIG. 2 is a flow chart of a method for generating and executing Boolean queries.

FIG. 2 is a flow chart of a method for generating and executing Boolean queries. Illustratively, the query management system 101, the data manager 102, the clustering manager 103, and the query manager 104 are a stored-program-controlled entity, such as a computer, which performs the methods of FIGS. 2-4 and 9-11 by executing a program stored in a storage medium, such as a memory or disk.

The process begins by getting 200 training data. The training data contains a plurality of training documents. Each of the plurality of training documents contains at least one training token. The plurality of training documents are clustered 201 into a plurality of clusters. The clustering is based on at least one training token in the plurality of training documents. Each cluster contains at least one training document. A Boolean query(s) is generated 202 for a cluster in the plurality of clusters based on an occurrence of a training token in the plurality of training documents. The process gets 203 production data. The production data contains a plurality of production documents. Each of the plurality of production documents contains at least one production token. The Boolean query(s) is executed 204 on the production documents in the production data.

Figure 3:
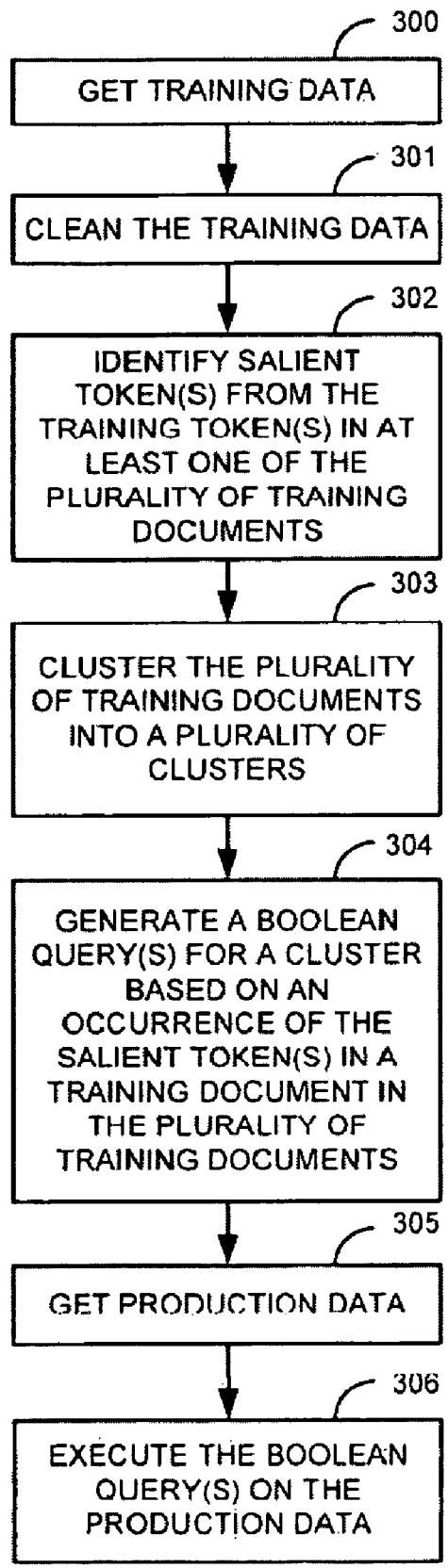
FIG. 3 is a flow chart of another method for generating and executing Boolean queries.

FIG. 3 is a flow chart of an alternative method for generating and executing Boolean queries. The process begins by getting 300 training data. The training data contains a plurality of training documents. Each of the plurality of training documents contains at least one training token. The plurality of training documents in the training data are cleaned 301. An example of cleaning 301 the plurality of training documents in the training data can be taking out word(s) (training token(s)) that occur very frequently in normal speech/text. These are words that don't carry useful information about the content of the text. Words such as "a", "the", "an", "from" and "of" are types of frequent words that can be cleaned from the training data. Other examples of cleaning 301 the training data include deleting training tokens such as "um" and "uh" from a transcript of speech conversations for calls in a call center.

The process identifies 302 a salient token(s) from the training token(s) in the plurality of training documents. A salient token is a token that is relevant to the plurality of training documents to be analyzed. A salient token is a token that occurs more or less frequently in documents in the plurality of training documents in relation to documents in other document collections. Identifying 302 salient token(s) can be accomplished by comparing frequencies of individual words (unigrams), sequences of words (e.g., bi-grams, tri-grams), parts of words, spoken words, video objects, and the like in the plurality of training documents with a generic-domain corpus. A generic-domain corpus is a base line of how frequently words/phrases/objects are used in a spoken/written language and/or video. For example, "Word Frequencies in Written and Spoken English" (Andrew Wilson, Geoffery Leech, Paul Rayson, ISBN 0582-32007-0, Prentice Hall, 2001), which is incorporated herein by reference, defines an example generic-domain corpus. Identifying salient words (i.e. words that are characteristic of our corpus) can be based on known algorithms such as Relative Frequency Ratio (RFR). For example, "Fred J. Damerau. Generating and evaluating domain-oriented multi-word terms from texts. Information Processing and Management 29(4): 433-447, 1993." discloses the use of RFR.

The plurality of training documents are clustered 303 into a plurality of clusters based on at least one training token in the plurality of training tokens and/or at least one salient token. A Boolean query(s) is generated 304 for a cluster based on occurrence of the salient token(s) in a training document in the plurality of training documents. The process gets 305 production data. The production data contains a plurality of production documents. Each of the plurality of production documents contains at least one production token. The Boolean query(s) is executed 306 on the plurality of production documents in the production data.

Figure 4:
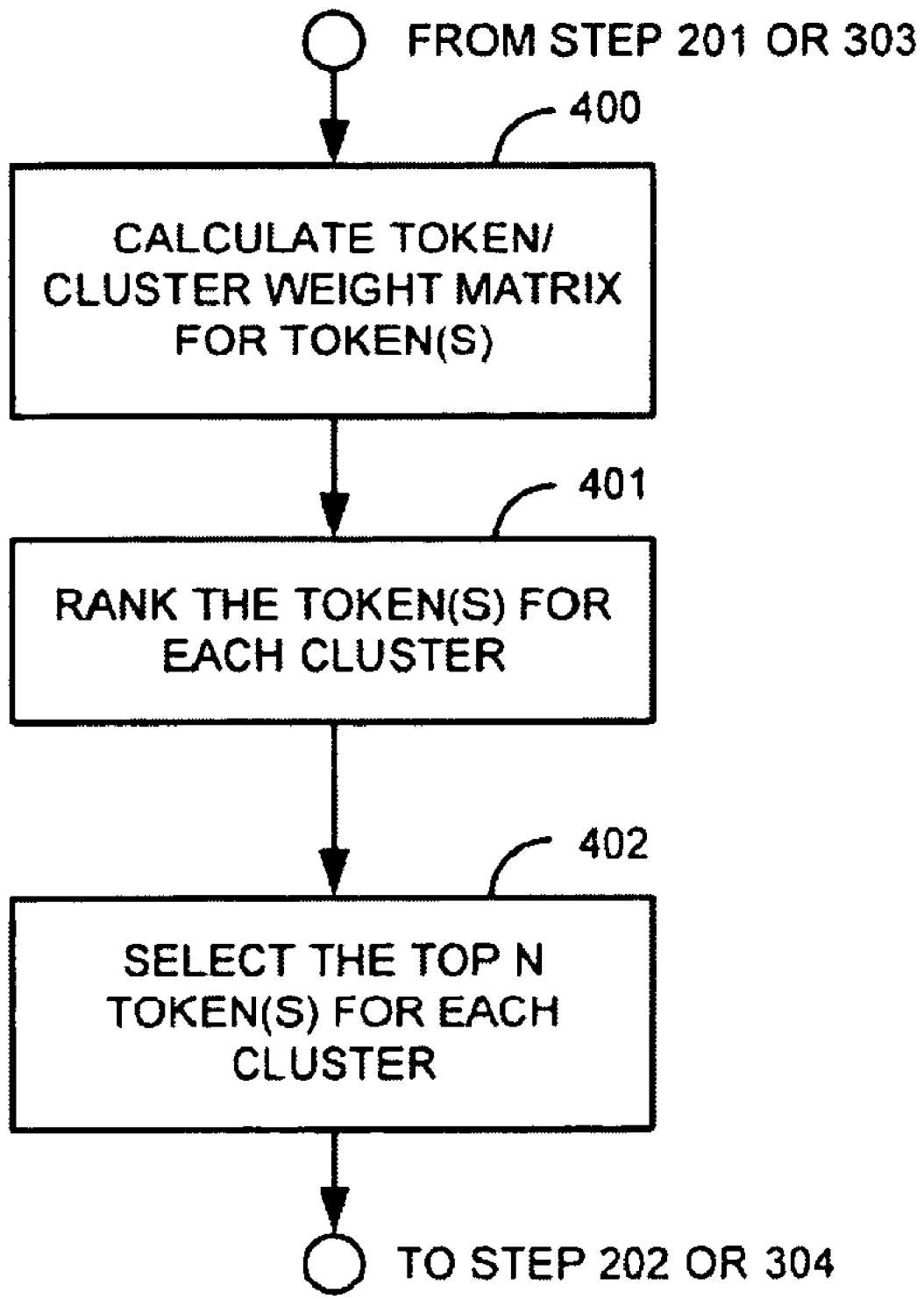
FIG. 4 is a flow chart of a method for weighting and ranking token(s)/salient token(s) in a cluster.

FIG. 4 is a flow chart of a method for weighting and ranking training token(s)/salient token(s) in a cluster. FIG. 4 is a flow diagram of steps that go between step 201 and step 202 in FIG. 2 or between step 303 and step 304 in FIG. 3. After clustering 201 or 303 the plurality of training documents into a plurality of clusters based on the training token(s)/salient token(s), the process calculates 400 a token/cluster weight matrix for the training tokens/salient token(s) (see FIG. 7 for an example token/cluster weight matrix). The training token(s)/salient token(s) are ranked 401 for each cluster (see FIG. 8 for an example of ranked tokens for each cluster). A list of the top N token(s)/salient token(s) is selected 402. N is a positive integer. N is usually determined based on the size and number of training documents. The process then goes to step 202 or step 304.

Figure 5:
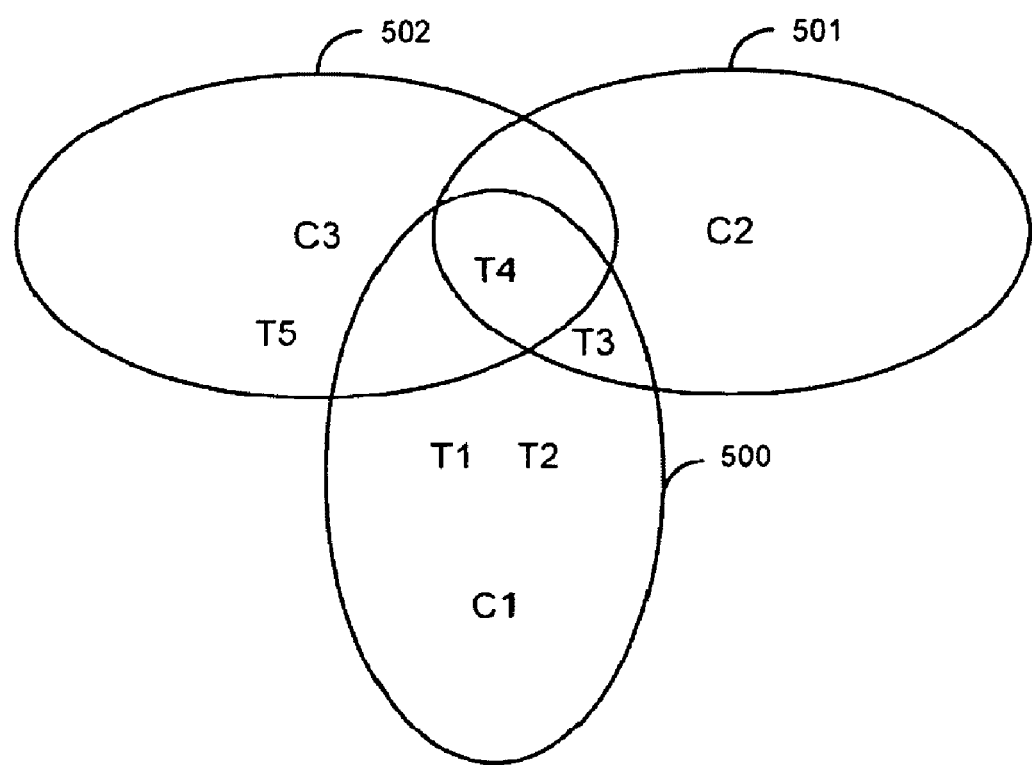
FIG. 5 is a diagram that illustrates a set of clusters and the distribution of training/salient tokens among them.

FIG. 5 is a diagram that illustrates a set of clusters 500-502 and the distribution of training/salient tokens among them. FIG. 5 is an illustrative example of clusters 500-502 that are generated in steps 201 and 303. FIG. 5 contains three clusters: cluster one 500, cluster two 501, and cluster three 502. Training documents are placed in clusters using known clustering algorithms. In this example, cluster one 500 has training documents that contain at least one of the training tokens/salient tokens T1 through T4. Cluster two 501 has training documents that contain training tokens/salient tokens T3 or T4. Cluster three 502 has training documents that contain training tokens/salient tokens T4 or T5. Training tokens/salient tokens T1-T5 can be training tokens or they can be salient tokens depending on the method used.

FIG. 6 is a table 600 that illustrates the percentage of training documents that contain a training token/salient token in each cluster 500-502. FIG. 6 is a table representation of the clusters 500-502 shown in FIG. 5. Each column represents a cluster 500-502. Each row represents a training token/salient token. The percentage number represents the percentage of training documents in the cluster 500-502 that contain the training token/salient token.

In this example, Token 1 (T1) is in 50% of the training documents in cluster one 500. T1 is not in any of the training documents in cluster two 501 or cluster three 502. Token 2 (T2) is in 30% of the training documents in cluster one 500. T2 is not in any of the training documents in cluster two 501 or cluster three 502. Token 3 (T3) is in 20% of the training documents in cluster one 500. T3 is in 50% of the training documents in cluster two 501. T3 is not in any of the training documents in cluster three 502. Token 4 (T4) is in 10% of the training documents in cluster one 500. T4 is in 15% of the training documents in cluster two 501. T4 is in 30% of the training documents in cluster three 502. Token 5 (T5) is not in any of the training documents in cluster one 500 or cluster two 501. T5 is in 10% of the training documents in cluster three 502.

FIG. 7 is a table 700 that illustrates the calculated 400 token/cluster weight matrix for each cluster 500-502. The following equation (Equation 1) is used to calculate 400 the token/cluster weight matrix for each cluster using the data from Table 600.

$$\text{weight}(t, C_j) = \frac{DF(t, C_j)/N_{C_j}}{1 + \sum_{i=1, i \neq j}^{m} DF(t, C_i)/N_{C_i}} \quad \text{Equation 1}$$

The weight $(t, C_j)$ is the weight of token t for cluster j. DF $(t, C_j)$ is the number of documents in cluster j that contain token t. $N_{C_j}$ is the total number of documents in cluster j. M (m) is the number of clusters. Equation 1 weights a token in a cluster by taking into account the descriptive and the discriminative power of the token for that cluster. Intuitively, a token is weighted higher if it appears in many documents in the cluster, but in only a few documents in the other clusters.

Using Equation 1, the weight of T1 for cluster one 500 would be calculated 400 as: 0.5/(1+0+0), or 0.5. The weight of T2 for cluster one 500 would be calculated 400 as: 0.3/(1+0+0), or 0.3. The weight of T3 for cluster one 500 would be calculated 400 as: 0.2/(1+0.5+0), or 0.133. The weight of T4 for cluster one 500 would be calculated 400 as: 0.1/(1+0.15+0.3), or 0.069. The weight for T5 is 0. Likewise, the values for cluster two 501 and cluster three 502 are calculated 400 using Equation 1 and are shown in Table 700.

FIG. 8 is a table 800 that illustrates the ranking 401 of token(s)/salient token(s) for each cluster 500-502. The following equation (Equation 2) is used to rank 401 the training token(s)/salient token(s) for each cluster 500-502.

$$\text{Max}_t \left[ \text{Min}_{i=1, i \neq j} (\text{weight}(t, C_j) - \text{weight}(t, C_i)) \right] \quad \text{Equation 2}$$

T (t) is the best token for cluster j->max weight difference with the cluster with the highest weight. For each cluster only the N top N tokens with a positive final weight (using Equation 2) are chosen. Using Equation 2, the ranking 401 of the token(s)/salient token(s) is derived as follows:

$T1\ C1=\min\{(0.5-0),(0.5-0)\}=0.5$ $C2=\min\{(0-0.5),(0-0)\}=-0.5$ $C3=\min\{(0-0),(0-0.5)\}=-0.5$ $T2\ C1=\min\{(0.3-0),(0.3-0)\}=0.3$ $C2=\min\{(0-0.3),(0-0)\}=-0.3$ $C3=\min\{(0-0),(0-0.3)\}=-0.3$ $T3\ C1=\min\{(0.133-0.417),(0.133-0)\}=-0.284$ $C2=\min\{(0.417-0.133),(0.417-0)\}=0.284$ $C3=\min\{(0-0.133),(0-0.417)\}=-0.417$ Likewise, the ranking 401 of T4-T5 is accomplished using Equation 2. The results of ranking 401 of T1-T5 in clusters 500-502 is shown in Table 800. The ranking 401 is organized from the highest number to the lowest number. A list of the top N number of training token(s)/salient token(s) are selected 402 for each cluster 500-502. N is a positive integer.

Figure 9:
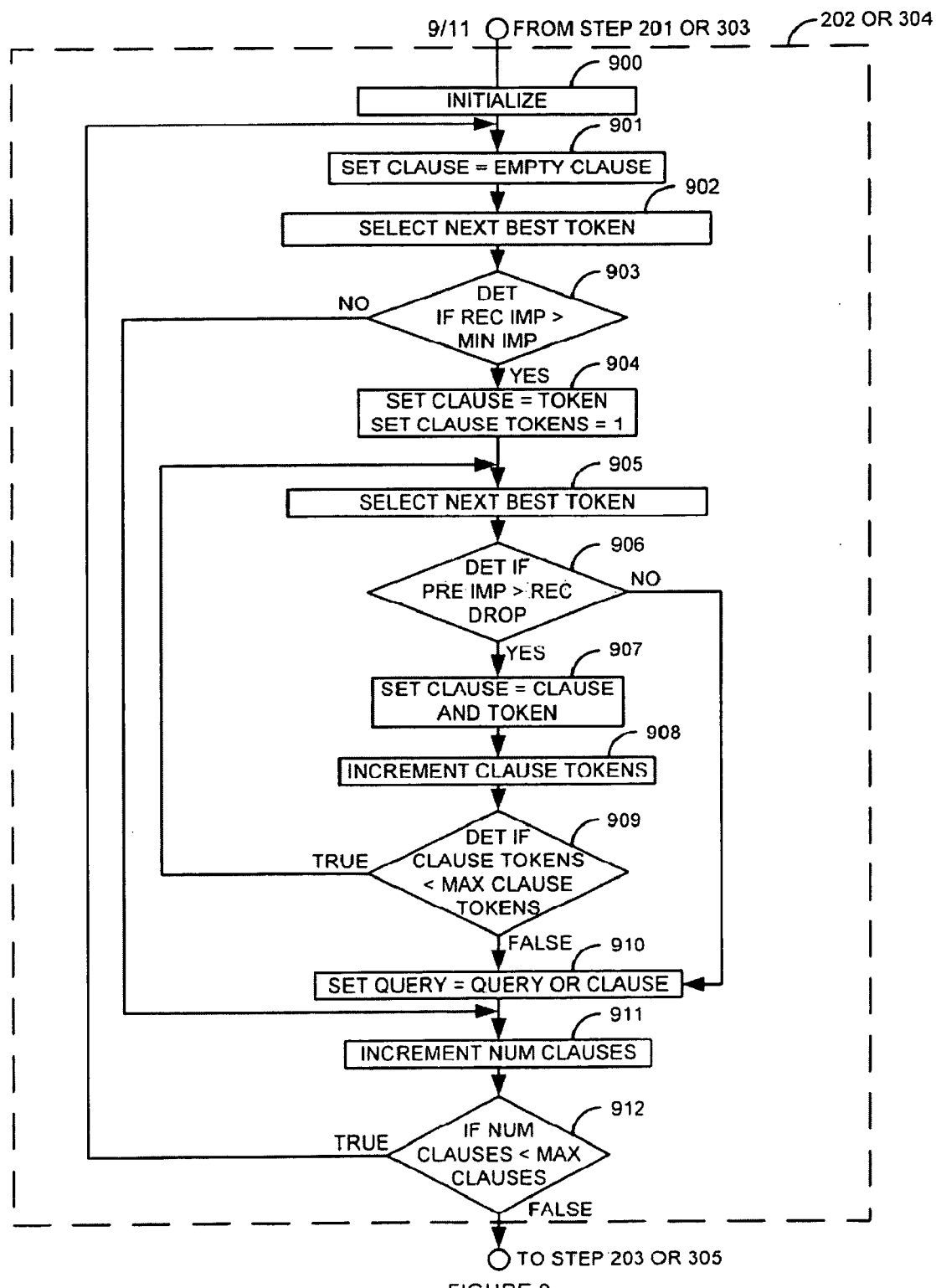
FIG. 9 is a flow chart of a method for generating Boolean queries using a Disjunctive Normal Form (DNF) algorithm.

FIG. 9 is a flow chart of a method for generating (202 or 304) Boolean queries using a Disjunctive Normal Form (DNF) algorithm. FIG. 9 is a flow diagram of either step 202 in FIG. 2 or step 304 in FIG. 3. The process described in FIG. 9 can be used for each cluster 500-502. The process begins by initializing 900. Initializing 900 can include, but is not limited to, setting the query to an empty query and getting the top N training tokens/salient tokens (see Table 800) for the cluster 500-502 for which the Boolean query is being generated (202 or 304). The top N training tokens/salient tokens for each cluster and their negative (the NOT of the training token/salient token) are put into a list. The clause is set 901 to an empty clause. The clause is a holder for building a group of tokens that are ANDed together. The next best training token/salient token for the clause is selected 902 from the top N list of training tokens/salient tokens for the cluster.

The next best training token/salient token is selected 902. For each token in the list of top N training token(s)/salient tokens(s) the next best training token/salient token is the one that maximizes the difference of true coverage and false coverage when ORed with the current query. True coverage is the number of correct documents retrieved. False coverage is the number in incorrect documents retrieved. The next best training token/salient token is selected by subtracting false coverage (Query ORed with the token) from the true coverage (Query ORed with the token).

If the recall improvement of ORing the training token/salient token is not greater than the minimum improvement in step 903, the process goes to step 911. Recall is the proportion of correct documents that are retrieved. Recall improvement is the recall of the query ORed with the training token/salient token minus the recall of the query. The minimum improvement is a threshold of improvement. If the recall improvement of ORing the training token/salient token is greater than the minimum improvement in step 903, clause is set 904 to the training token/salient token and variable clause tokens is set to one. The variable clause tokens is the number of training tokens/salient tokens currently in the clause.

The process selects 905 the next best training token/salient token as described in step 902. The next best training token/salient token is the one that maximizes the difference of true coverage and false coverage when ANDed with the current clause. This is the true coverage (query OR (clause AND token)) minus false coverage (query OR (clause AND token)). The process determines 906 if a precision improvement of ANDing the training token/salient token is greater than a recall drop. The recall drop and precision improvement can be calculated in various ways. For example, the recall drop can be the number of true documents that are missed by including the training token/salient token in the Boolean equation. The precision improvement can be the number of false documents that are eliminated by the Boolean query by including the training token/salient token (or NOT token) in the Boolean query. A true document is a document that is in the cluster (the document could be in other clusters). A false document is a document that is not in the cluster. The recall improvement is the true document(s) that are added relative to the true documents that are added by the training tokens/salient tokens that are already in the Boolean query.

As a second exemplary process, the recall drop can be calculated using the following process. The recall drop is the recall (query OR clause) minus recall (query OR (clause AND token)). The precision improvement is the precision (query OR (Clause AND token)) minus precision (query OR clause). If the precision improvement of ANDing the training token/salient token is not greater than the recall drop in step 906, the process goes to step 910.

If the precision improvement of ANDing the training token/salient token is greater than the recall drop in step 906, the process sets 907 the clause equal to the clause ANDed with the training token/salient token. The process increments 908 the variable clause tokens.

The process determines 909 if the variable clause tokens is less than the variable max clause tokens. The variable max clause tokens is a predefined number that sets a limit on the number of training tokens/salient tokens that will be in a clause. If the variable clause tokens is less than max clause tokens in step 909, the process goes to step 905 to select the next best training token/salient token. Otherwise, if the variable clause tokens is not less than the variable max clause tokens in step 909, the query is set 910 equal to the query ORed with the clause. The variable num clauses is incremented 911. The process determines 912 if the variable num clauses is less than the variable max clauses. Max clauses is a limit on the number of clauses allowed in the Boolean query. If the variable num clauses is less than max clauses, the process goes to step 901 so a new clause can be generated. Otherwise, if the variable num clauses is not less than the variable max clauses in step 912, the process goes to step 203 or 305.

As an example of using the method of FIG. 9, assume the five ranked training tokens/salient tokens for cluster one 500 from Table 800 are the number (N) of ranked training tokens/salient tokens. Assume the following values: min improvement=10%, max clause tokens=2, and max clauses=2. As discussed above, the list of N training tokens/salient tokens (and token NOT) can be determined by subtracting the false coverage (negative training documents) from the precision improvement (positive training documents). Using FIG. 6, the following calculations would occur for cluster one 500.

| Token  | Calculation               | Rank     |
|--------|---------------------------|----------|
| T1     | 50% – 0% = 50%            | 2        |
| NOT T1 | 50% – 100% = –50%         | 10       |
| T2     | 30% – 0% = 30%            | 3        |
| NOT T2 | 70% – 100% = –30%         | 7-9      |
| T3     | 20% – 50% = –30%          | 7-9      |
| NOT T3 | 80% – 100% = –20%         | 6        |
| T4     | 10% – 30%-45% = –20% to –35% | 7-9   |
| NOT T4 | 90% – 85%-100% = 5% to –10% | 4      |
| T5     | 0% – 10% = –10%           | 5        |
| NOT T5 | 100% – 10% = 90%          | 1        |

The above calculations are based on percentages of documents. However, other methods can be used. For example, calculations based on the number of documents can be used. T1 is calculated based the true coverage (50% of positive documents added) minus the false coverage (0% of negative documents added), or 0.5. NOT T1 is calculated based on a true coverage of 50% (NOT T1 adds 50% of the training documents) minus the false coverage of 100% (NOT T1 adds 100% of the training documents in both C2 and C3), or –0.5. The same calculations are used for T2. T3 is calculated based on the true coverage of 20% minus the false coverage of 50%. NOT T3 is calculated based on the true coverage of 80% minus the false coverage of 100% (i.e. 100% of the training documents in cluster three 502). Likewise, the values for T4-T5 are calculated using the same method. Note that the values calculated for T4 and NOT T4 contain a range of values because there can be overlap from C2 to C3 (i.e., the same training document may be in both clusters).

After initializing 900 and setting 901 the clause to an empty clause, the process selects 902 the highest ranked training token/salient token NOT T5. The process determines 903 that the recall improvement for NOT T5 (100%) is greater than the minimum improvement (10%). The clause is set 904 to NOT T5 and clause tokens is set to one. The next best training token/salient token (T1) is selected 905. The process determines 906 that the precision improvement for T1 (100%) is greater than the recall drop for T1 (50%). The clause (NOT T5) is set 907 to the current clause value (NOT T5) ANDed with the current token T1 producing a clause value of (NOT T5 AND T1). Clause tokens is incremented 908 to two. The process determines 909 that clause tokens (2) is not less than max clause tokens (2). The query (NOT T5 AND T1) is set 910 to the query ORed with the clause ((NOT T5 AND T1) OR). Num clauses is incremented 911 to one. The process determines 912 that num clauses (1) is less than max clauses (2).

The process sets 901 the clause to an empty clause. The process selects 902 the next best training token/salient token T2. The process determines 903 that the recall improvement for T2 is (30%) is greater than the minimum improvement (10%) for T2. The clause is set 904 to T2 and clause tokens is set to one. The next best training token/salient token (NOT T4) is selected 905. The process determines that the precision improvement for NOT T4 50% (assume 50% of the retrieved documents are true) is greater than the recall drop for NOT T4 (10%). The clause is set 907 to clause (T2) ANDed with the training token/salient token NOT T4 (T2 AND NOT T4). Clause tokens is incremented 908 to two. The process determines 909 that clause tokens (2) is not less than max clause tokens (2). The query is set 910 to the query (NOT T5 AND T1) ORed with the clause (T2 AND NOT T4), or ((NOT T5 AND T1) OR (T2 AND NOT T4)). Num clauses is incremented 911 to two. The process determines that num clauses (2) is not less than max clauses (2). The process goes to step 203 or 305. The generated Boolean query is ((NOT T5 AND T1) OR (T2 AND NOT T4)).

The example above discloses one way of determining 906 if the precision improvement is greater than the recall drop. In the example above, the precision improvement is based on the selected next best token from step 905. However, the precision improvement in step 905 can be calculated in real time based on the current query.

Figure 10:
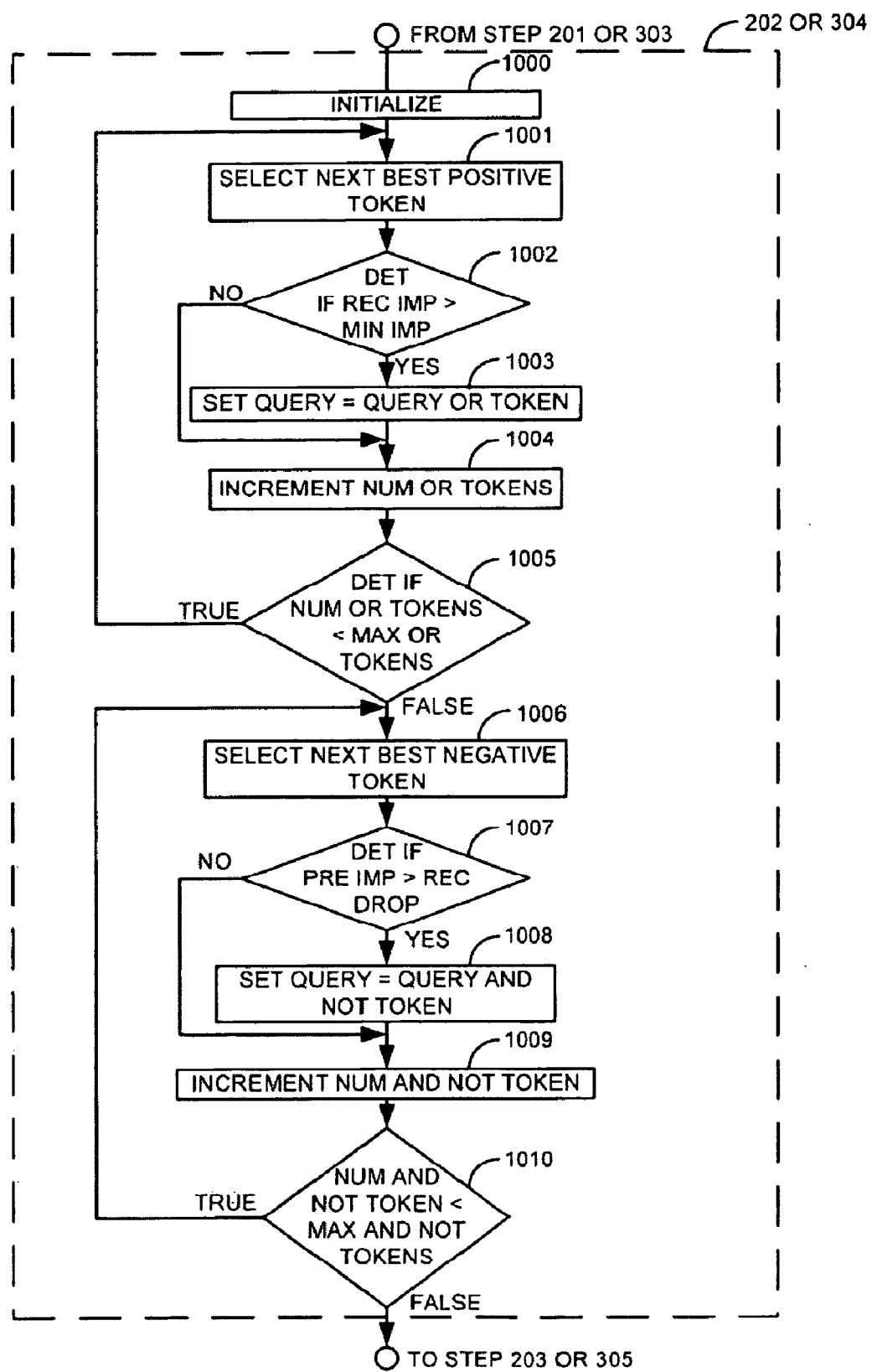
FIG. 10 is a flow chart of a method for generating Boolean queries using an OR-BUT-NOT algorithm.

FIG. 10 is a flow chart of a method for generating (202 or 304) Boolean queries using an OR-BUT-NOT algorithm. FIG. 10 is a flow diagram of either step 202 in FIG. 2 or step 304 in FIG. 3. The process begins by initializing 1000. Initializing 1000 can include, but is not limited to setting the query to an empty query, setting the variable num OR tokens to zero, setting the variable num AND not token to zero, and getting the top N training tokens/salient tokens (see FIG. 8) for the cluster 500-502 that the Boolean query is being generated (202 or 304). The next best positive training token/salient token is selected 1001.

The process determines 1002 if the recall improvement is greater than the minimum improvement for the selected positive training token/salient token. If the recall improvement is not greater than the minimum improvement in step 1002, the process goes to step 1004. Otherwise, the query is set 1003 to the query ORed with the selected positive training token/salient token. The variable num OR tokens is incremented 1004. Num OR tokens is the number of training tokens/salient tokens that have been processed from the list of N training tokens/salient tokens. The process determines 1005 if the variable num OR tokens is less than max OR tokens. Max OR tokens is the maximum number of training tokens/salient tokens that will be ORed in the generated Boolean query. If the num OR tokens is less than max OR tokens in step 1005, the process goes to step 1001 to select the next best positive training token/salient token.

Otherwise, the next best negative training token/salient token is selected 1006. The process determines 1007 if a precision improvement is greater than a recall drop for the selected negative training token/salient token. If the precision improvement is not greater than the recall drop in step 1007, the process goes to step 1009. Otherwise, if the precision improvement is greater than the recall drop in step 1007, the query is set 1008 to the query ANDed with the selected next best negative training token/salient token. The variable num AND NOT token is incremented 1009. Num AND NOT token is the number of negative training tokens/salient tokens that have been processed. The process determines 1010 if num AND NOT token is less than max AND NOT token. Max AND NOT tokens is the maximum number of NOT training tokens/salient tokens that will be processed. If num AND NOT tokens is less than max AND NOT tokens, the process goes to step 1006 and selects the next best negative training token/salient token. Otherwise, the process goes to step 203 or 305.

As an example of using the method of FIG. 10, assume the five ranked training tokens/salient tokens for cluster one 500 from Table 800 are the number (N) of ranked tokens. Assume the following values: min improvement=10%, max OR tokens=2, and max AND NOT tokens=2. As discussed above, the list of N training tokens/salient tokens (and token NOT) is determined by subtracting the false coverage (negative training documents) from the true coverage (positive training documents). Using FIG. 6, the following calculations would occur for cluster one 500 for the positive and negative training tokens/salient tokens.

| Positive | Training token/salient token | Rank |
|---|---|---|
| T1 | 50% – 0% = 50% | 1 |
| T2 | 30% – 0% = 30% | 2 |
| T3 | 20% – 50% = –30% | 4-5 |
| T4 | 10% – 30%-45% = –20% to –35% | 4-5 |
| T5 | 0% – 10% = –10% | 3 |

| Negative | Training token/salient token | Rank |
|---|---|---|
| NOT T1 | 50% – 100% = –50% | 5 |
| NOT T2 | 70% – 100% = –30% | 4 |
| NOT T3 | 80% – 100% = –20% | 3 |
| NOT T4 | 90% – 85%-100% = 5% to –10% | 2 |
| NOT T5 | 100% – 10% = 90% | 1 |

After initializing 1000, the next best positive training token/salient token T1 is selected 1001. The process determines 1002 that the recall improvement for T1 (50%) is greater than the minimum improvement (10%). The query is set 1003 to the query ORed selected positive token (T1). Num OR tokens is incremented to one. The process determines 1005 that num OR tokens (1) is less than max OR tokens (2). The next best positive token T2 is selected 1001. The recall improvement for T2 is the number of new training documents that will be added based on including T2 in the Boolean query. The recall improvement for T2 could be from 0% to 30% depending on how many new documents will be added by including T2. For example, if T2 is not in any of the training document that contain T1, the recall improvement for T2 would be 30%. If half of the documents that contain T2 also contain T1, then the recall improvement for T2 would be 15% because adding T2 to the Boolean query would add 15% new training documents. For this example, assume that the recall improvement is 15%. The process determines 1002 that the recall improvement for T2 (15%) is greater than the minimum recall improvement (10%). The query is set 1003 to the query ORed with the selected next best positive token (T1 OR T2). Num OR tokens is incremented 1004 to two. The process determines 1005 that num OR tokens (2) is not less than max OR tokens (2).

The next best negative token (NOT T5) is selected 1006. The process determines 1007 that the precision improvement of NOT T5 50% (assume 50% of the retrieved documents are true) is greater than the recall drop (0%). The query is set 1008 to the query AND NOT T5, or ((T1 OR T2) AND NOT T5). The variable num AND NOT tokens is incremented 1009 to one. The process determines 1010 that num AND NOT token (1) is less than max AND NOT tokens (2). The next best negative training token/salient token (NOT T4) is selected 1006. The process determines 1007 that the precision improvement for NOT T4 50% (assume 50% of the retrieved documents are true) is greater than the recall drop (10%). The query is set 1008 to the query AND NOT T4, or (T1 OR T2) AND NOT T5 AND NOT T4. The variable num AND NOT token is incremented 1009 to two. The process determines 1010 that num AND NOT token (2) is not less than max AND NOT tokens (2). The process goes to step 2003 or 305. The generated query is (T1 OR T2) AND NOT T5 AND NOT T4.

The example above discloses one way of determining 1007 if the precision improvement is greater than the recall drop. In the example above, the precision improvement is based on the selected next best negative token from step 1006. However, the precision improvement in step 1007 can be calculated in real time based on the current query.

Figure 11:
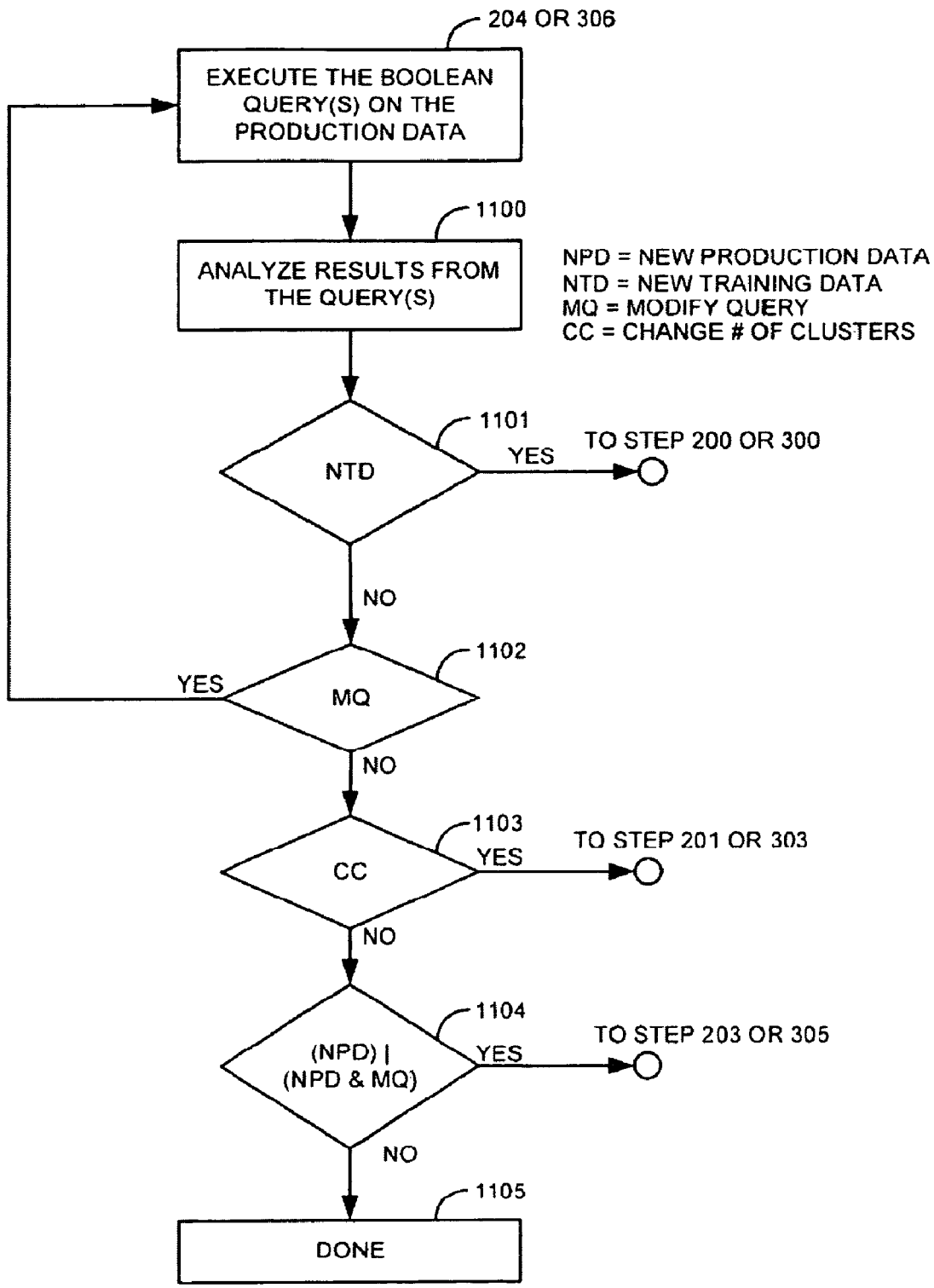
FIG. 11 is a flow chart of a method for analyzing the query results based on new training data, new production data, a request to modify a query, and/or a request to change the number of clusters.

FIG. 11 is a flow chart of a method for analyzing the query results based on new training data, new production data, a request to modify a query, and/or a request to change the number of clusters. The process begins after executing 204 or 306 the Boolean query(s) on the plurality of production documents in the production data. The results of the Boolean query(s) are analyzed 1100 to determine if the Boolean query (s) are effective. The analyzing 1100 could be a manual or an automated process.

For example, if a manager determined that the types of calls in a call center have changed, then a new set of training data and production data may be required to generate the appropriate Boolean query(s) for the current state of the call center. There is a potential that some of the Boolean query(s) that were generated are not effective in selecting production documents that are pertinent to the cluster. The manager may want to delete one or more of the generated Boolean queries in order to get production documents that better match important topics in the production data. The number of clusters that are generated in steps 201 and 303 can be changed based on identifying the training documents in one or more clusters that have been previously generated and rerunning the process of FIG. 2 or 3 using the training documents in the cluster as the training data.

After analyzing 1100 the results of the Boolean queries, the process determines 1101 if there is new training data. If there is new training data in step 1101, the process goes to step 200 or 300. Otherwise, the process determines 1102 if a one or more of the Boolean queries needs to be modified. If the Boolean queries need to be modified, the process goes to step 204 or 306. Otherwise, the process determines 1103 if the number of clusters needs to be changed. If the number of clusters needs to be changed, the process goes to step 201 or 303. Otherwise, the process determines 1104 if there is new production data or new production data and one or more of the Boolean queries need to be modified. If there is new production data or new production data and one or more of the Boolean queries need to be modified, the process goes to step 203 or 305. Otherwise, the process is done 1105.

Of course, various changes and modifications to the illustrative embodiment described above will be apparent to those skilled in the art. For example, per clustering data (manually or automatically) to only add new training data that is from a certain class or adding key words to the queries, even though the terms don't show up in the training data. These changes and modifications can be made without departing from the spirit and the scope of the system and method and without diminishing its attendant advantages. It is therefore intended that such changes and modifications be covered by the following claims except insofar as limited by the prior art. In addition, in the claims, when referring to an element in the singular (e.g. a production token), the element should also be viewed to include the one or more of the element (e.g. one or more production tokens).

What is claimed is:

1. A system for generating a Boolean query comprising:
   a. a processor;
   b. a memory coupled to the processor;
   c. a data manager configured to get training data and production data,
      wherein the training data comprises a plurality of training documents and each of the plurality of training documents comprises at least one training token, and
      wherein the production data comprises a plurality of production documents and each of the plurality of production documents comprises at least one production token;
   d. a clustering manager configured to cluster the plurality of training documents into a plurality of clusters based on the at least one training token in the plurality of training documents, wherein each cluster of the plurality of said clusters comprises at least one training document; and
   e. a query manager configured to generate the Boolean query for a cluster of the plurality of clusters based on an occurrence of the at least one training token in the at least one training document of the plurality of training documents, and to execute the Boolean query on the plurality of production documents in the production data.

2. The system of claim 1, wherein the at least one training token comprises a plurality of training tokens and wherein the data manager is configured to calculate a training token/cluster weight matrix for the plurality of training tokens for the cluster, to rank the plurality of training tokens for the cluster according to the matrix, and to select a list of top N training tokens from the ranked plurality of training tokens for the cluster, where N is a positive integer.

3. The system of claim 2, wherein the query manager is configured to:
   set a clause equal to an empty clause,
   select a next best training token from the top N training tokens, determine whether a recall improvement is greater than a minimum improvement,
   determine whether a number of clauses is less than a maximum number of clauses in response to the recall improvement not being greater than the minimum improvement,
   respond to determining that the recall improvement is not greater than the minimum improvement by setting the clause to the selected next best training token,
   respond to the recall improvement being greater than the minimum improvement by selecting the next best training token,
   determine whether a precision improvement is greater than a recall drop,
   set a new value of a query equal to a current value of the query ORed with the clause responsive to the precision improvement not being greater than the recall drop,
   set a new value of the clause equal to a current value of the clause ANDed with the selected next best training token responsive to the precision improvement being greater than the recall drop,
   determine whether a number of clause tokens is less than a maximum number of clause tokens,
   select the next best training token responsive to the number of clause tokens being less than the maximum number of clause tokens,
   set the query equal to the query ORed with the clause responsive to the number of clause tokens not being less than the maximum number of clause tokens,
   determine whether the number of clauses is less than the maximum number of clauses,
   set the clause to the empty clause responsive to the number of clauses being less than the maximum number of clauses, and execute the query on the production data responsive to the number of clauses not being less than the maximum number of clauses.

4. The system of claim 2, wherein the query manager is configured to:
select a next best positive training token from the top N training tokens,
determine whether a recall improvement is greater than a minimum improvement,
determine whether a number of OR tokens is less than a maximum number of OR tokens responsive to the recall improvement not being greater then the minimum improvement,
respond to the recall improvement being greater than the minimum improvement by setting a new value of a query equal to a current value of the query ORed with the selected next best positive training token,
respond to the recall improvement not being greater than the minimum improvement by determining if the number of OR tokens is less than the maximum number of OR tokens,
select the next best positive training token responsive to the number of OR tokens being less than the maximum number of OR tokens,
select a next best negative training token responsive to the number of OR tokens not being less than the maximum number of OR tokens,
determine whether a precision improvement is greater than a recall drop,
respond to the precision improvement not being greater than the recall drop by determining if a number of AND NOT tokens is less than a maximum number of AND NOT token,
set a new value of the query equal to a current value of the query ANDed with the selected next best negative training token responsive to the precision improvement being greater than the recall drop,
determine whether the number of AND NOT tokens is less than the maximum number of AND NOT tokens,
select the next best negative training token responsive to the number of AND NOT tokens being less than the maximum number of AND NOT tokens, and
execute the Boolean query on the production data responsive to the number of AND NOT tokens not being less than the maximum number of AND NOT tokens.

5. The system of claim 1, wherein the data manager is configured to:
analyze results from the Boolean query,
determine whether there is new training data,
get new training data responsive to there being new training data,
determine whether the Boolean query has been modified responsive to there not being new training data,
execute the Boolean query on the plurality of production documents in the production data responsive to the Boolean query being modified,
determine whether there is a change in the number of clusters responsive to the Boolean query not being modified,
cluster the plurality of training documents into a plurality of clusters based on at least one training token in the plurality of training documents responsive to there being a change in the number of clusters,
respond to there not being a change in the number of clusters by determining if there is new production data,
get production data responsive to either (a) there being new production data or (b) there being new production data and the Boolean query having been modified,
being done responsive to either (c) there not being new production data or (d) there not being new production data and the Boolean query having not been modified.

6. The system of claim 1, wherein the data manager is configured to get second production data, wherein the second production data comprise a plurality of second production documents and wherein each of the plurality of second production documents comprises at least one second production token and the query manager is configured to execute the Boolean query on the plurality of second production documents in the second production data.

7. The system of claim 1, wherein clustering the training data is accomplished by an algorithm selected from the group comprising: a k-means, a bisecting k-means, an agglomerative, and a divisive hierarchical.

8. The system of claim 1, wherein the plurality of training documents and/or the plurality of production documents comprises one item selected from the group comprising: a document, an email, a content of a website, a content of a blog, a transcript of a voice call, an identifiable item from a video, an identifiable item from a picture, a transcript of a conversation, a document containing different languages, and a transcript of an audio portion of a video.

9. The system of claim 1, wherein the training token is an item selected from the group comprising: a word, a part of a word, a phrase, a bi-gram, and a tri-gram.

10. A system for generating a Boolean query comprising:
a. a processor;
b. a memory coupled to the processor:
c. a data manager configured to get training data and production data,
wherein the training data comprises a plurality of training documents and each of the plurality of training documents comprises at least one training token,
wherein the production data comprises a plurality of production documents and each of the plurality of production documents comprises at least one production token, and
wherein data manager is configured to clean the training data, and identify at least one salient token from the at least one training token in each of the plurality of training documents;
d. a clustering manager configured to cluster the plurality of training documents into a plurality of clusters based on the at least one training token in the plurality of training documents or the at least one salient token, wherein each cluster comprises at least one training document; and
e. a query manager configured to generate the Boolean query for a cluster of the plurality of clusters based on an occurrence of the at least one salient token in the at least one training document of the plurality of training documents, and to execute the Boolean query on the plurality of production documents in the production data.

11. The system of claim 10, wherein the at least one salient token comprises a plurality of salient tokens and wherein the data manager is further configured to calculate a salient token/cluster weight matrix for the plurality of salient tokens for the cluster, to rank the plurality of salient tokens for the cluster according to the matrix, and to select a list of the top N salient tokens from the ranked plurality of training tokens for the cluster, where N is a positive integer.

12. The system of claim 11, wherein the query manager is configured to:

set a clause equal to an empty clause,
select a next best salient token from the top N salient tokens,
determine whether a recall improvement is greater than a minimum improvement,
determine if whether a number of clauses is less than a maximum number of clauses responsive to the recall improvement not being greater than the minimum improvement,
respond to determining that the recall improvement is not greater than the minimum improvement by setting the clause to the selected next best salient token,
respond to the recall improvement being greater than the minimum improvement by selecting the next best salient token,
determine whether a precision improvement is greater than a recall drop,
set new value of a query equal to a current value of the query ORed with the clause responsive to the precision improvement not being greater than the recall drop,
set a new value of the clause equal to a current value of the clause ANDed with the selected next best salient token responsive to the precision improvement being greater than the recall drop,
determine whether the number of clause tokens is less than the maximum number of clause tokens,
select the next best salient token responsive to the number of clause tokens being less than the maximum number of clause tokens,
set the query equal to the query ORed with the clause responsive to the number of clause tokens not being less than the maximum number of clause tokens,
determine whether a number of clauses is less than a maximum number of clauses,
set the clause to the empty clause responsive to the number of clauses being less than the maximum number of clauses, and
execute the Boolean query on the production data responsive to the number of clauses not being less than the maxim number of clauses.

13. The system of claim 11, wherein the query manager is configured to:
select a next best positive salient token from the top N salient tokens,
determine whether a recall improvement is greater than a minimum improvement,
determine whether a number of OR tokens is less than a maximum number of OR tokens responsive to the recall improvement not being greater than the minimum improvement,
respond to the recall improvement being greater than the minimum improvement by setting a new value of a query equal to a current value of the query ORed with the selected next best positive salient token,
respond to the recall improvement not being greater than the minimum improvement by determining if the number of OR tokens is less than the maximum number of OR tokens,
select the next best positive salient token responsive to the number of OR tokens being less than the maximum number of OR tokens,
select a next best negative salient token responsive to the number of OR tokens not being less than the maximum number of OR tokens,
determine whether a precision improvement is greater than a recall drop,
respond to the precision improvement not greater than the recall drop by determining if a number of AND NOT tokens is less than a maximum number of AND NOT tokens,
set a new value of the query equal to a current value of the query ANDed with the selected next best negative salient token responsive to the precision improvement being greater than the recall drop,
determine whether the number of AND NOT tokens is less than the maximum number of AND NOT tokens,
select the next best negative salient token responsive to the number of AND NOT tokens being less than the maximum number of AND NOT tokens, and
execute the Boolean query on the production data responsive to the number of AND NOT tokens not being less than the maximum number of AND NOT tokens.

14. The system of claim 10, wherein the data manager is configured to:
analyze results from the Boolean query,
determine whether there is new training data,
get new training data responsive to there being new training data,
determine whether the Boolean query has been modified responsive to there not being new training data,
execute the Boolean query on the plurality of production documents in the production data responsive to the Boolean query being modified,
determine whether there is a change in the number of clusters responsive to the Boolean query not being modified,
cluster the plurality of training documents into a plurality of clusters based on at least one training token in the plurality of training documents responsive to there being a change in the number of clusters,
respond to there not being a change in the number of clusters by determining if there is new production data,
get production data responsive to either (a) there being new production data or (b) there being new production data and the Boolean query having been modified,
being done responsive to either (c) there not being new production data or (d) there not being new production data and the Boolean query having not been modified.

15. The system of claim 10, wherein the data manager is configured to get a second production data, wherein the second production data comprises a plurality of second production documents and wherein each of the plurality of second production documents comprises a second production token and the query manager is configured to execute the Boolean query on the plurality of second production documents in the second production data.

16. The system of claim 10, wherein clustering the training data is accomplished by an algorithm selected from the group comprising: a k-means, a bisecting k-means, an agglomerative, and a divisive hierarchical.

17. The system of claim 10, wherein the plurality of training documents and/or the plurality of production documents comprises one item selected from the group comprising: a document, an email, a content of a website, a content of a blog, a transcript of a voice call, an identifiable item from a video, an identifiable item from a picture, a transcript of a conversation, a document containing different languages, and a transcript of an audio portion of a video.

18. The system of claim 10, wherein the salient token is an item selected from the group comprising: a word, a part of a word, a phrase, a bi-gram, and a tri-gram.

19. A computer implemented method for generating a Boolean query comprising:

a. getting training data, by a processor, wherein the training data comprises a plurality of training documents and wherein each of the plurality of training documents comprises at least one training token;
b. clustering the plurality of training documents, by the processor, into a plurality of clusters based on the at least one training token of the plurality of training documents, wherein each cluster comprises at least one training document;
c. generating, by the processor, the Boolean query for a cluster of the plurality of clusters based on an occurrence of the at least one training token in the at least one training document of the plurality of training documents;
d. getting production data, wherein the production data comprises a plurality of production documents and wherein each of the plurality of production documents comprises at least one production token; and
e. executing, by the processor, the Boolean query on the plurality of production documents in the production data.

20. The method of claim 19, wherein the at least one training token comprises a plurality of training tokens and wherein the step of generating the Boolean query for the cluster in the plurality of clusters further comprises the steps of:
   f. calculating a training token/cluster weight matrix for the plurality of training tokens for the cluster;
   g. ranking the plurality of training tokens for the cluster according to the matrix; and
   h. selecting a list of the top N training tokens from the ranked plurality of training tokens for the cluster, where N is a positive integer.

21. The method of claim 20, wherein generating the Boolean query further comprising the steps of:
   i. setting a clause to an empty clause;
   j. selecting a next best training token from the top N training tokens;
   k. determining whether a recall improvement is greater than a minimum improvement;
   l. responsive to the recall improvement not being greater than the minimum improvement, going to step (u);
   m. responsive to the recall improvement being greater than the minimum improvement, setting the clause equal to the selected next best training token;
   n. selecting the next best training token from the top N training tokens;
   o. determining whether a precision improvement is greater than a recall drop;
   p. responsive to the precision improvement not being greater than the recall drop, going to step (t);
   q. responsive to the precision improvement being greater than the recall drop, setting the clause equal to the clause ANDed with the selected next best training token;
   r. determining whether a number of clause tokens is less than a maximum number of clause tokens;
   s. responsive to the number of clause tokens being less than the maximum number of clause tokens, going to step (n);
   t. responsive to the number of clause tokens not being less than the maximum number of clause tokens, setting the query equal to the query ORed with the clause;
   u. determining whether a number of clauses is less than a maximum number of clauses;
   v. responsive to the number of clauses being less than the maximum number of clauses, going to step (i); and
   w. responsive to the number of clauses not being less than the maximum number of clauses, going to step (d).

22. The method of claim 20, wherein generating the Boolean query further comprises the steps of:
   i. selecting a next best positive training token from the top N training tokens;
   j. determining if whether a recall improvement is greater than a minimum improvement;
   k. responsive to the recall improvement not being greater than the minimum improvement, going to step (m);
   l. responsive to the recall improvement being greater than the minimum improvement, setting a query equal to the query ORed with the selected next best positive training token;
   m. determining whether a number of OR tokens is less than a maximum number of OR tokens;
   n. responsive to the number of OR tokens being less than the maximum number of OR tokens, going to step (i);
   o. responsive to the number of OR tokens not being less than the maximum number of OR tokens, selecting a next best negative training token from the top N training tokens;
   p. determining whether a precision improvement is greater than a recall drop;
   q. responsive to the precision improvement not being greater than the recall drop, going to step (s);
   r. responsive to the precision improvement being greater than the recall drop, setting the query equal to the query ANDed with the selected next best negative training token;
   s. determining whether a number of AND NOT tokens is less than a maximum number of AND NOT tokens;
   t. responsive to the number of AND NOT tokens being less than the maximum number of AND NOT tokens, going to step (o); and
   u. responsive to the number of AND NOT tokens not being less than the maximum number of AND NOT tokens, going to step (d).

23. The method of claim 19, further comprising the steps of:
   f. analyzing results from the Boolean query;
   g. determining whether there is new training data;
   h. responsive to there being new training data, going to step (a);
   i. responsive to there not being new training data, determining whether the Boolean query has been modified;
   j. responsive to the Boolean query being modified, going to step (e);
   k. responsive to the Boolean query not being a modified, determining whether there is a change in the number of clusters;
   l. responsive to there being a change in the number of clusters, going to step (b);
   m. responsive to there not being a change in the number of clusters, determining if whether there is new production data, or whether there is new production data and the Boolean query has been modified;
   n. responsive to there being new production data, or there being new production data and the Boolean query has been modified, going to step (d); and
   o. responsive to there not being new production data or there not being new production data and the Boolean query has not been modified, being done.

24. The method of claim 19, further comprising the steps of:
   f. getting a second production data, wherein the second production data comprises a plurality of second production documents and wherein each of the plurality of second production documents comprises a second production token; and g. executing the Boolean query on the plurality of second production documents in the second production data.

25. The method of claim 19, wherein clustering the training data is accomplished by an algorithm selected from the group comprising: a k-means, a bisecting k-means, an agglomerative, and a divisive hierarchical.

26. The method of claim 19, wherein the plurality of training documents and/or the plurality of production documents comprises one item selected from the group comprising: a document, an email, a content of a website, a content of a blog, a transcript of a voice call, an identifiable item from a video, an identifiable item from a picture, a transcript of a conversation, a document containing different languages, and a transcript of an audio portion of a video.

27. The method of claim 19, wherein the at least one training token is an item selected from the group comprising: a word, a part of a word, a phrase, a bi-gram, and a tri-gram.

28. A computer implemented method for generating a Boolean query comprising:
   a. getting training data, wherein the training data comprises a plurality of training documents and wherein each of the plurality of training documents comprises at least one training token;
   b. cleaning the training data;
   c. identifying, by a processor, at least one salient token from the at least one training token in each of the plurality of training documents;
   d. clustering the plurality of training documents into a plurality of clusters based on the at least one training token in the plurality of training documents or the at least one salient token, wherein each cluster comprises at least one training document;
   e. generating the Boolean query for a cluster of the plurality of clusters based on an occurrence of at least one salient token in the at least one training document of the plurality of training documents;
   f. getting production data, wherein the production data comprises a plurality of production documents and wherein each of the plurality of production documents comprises at least one production token; and
   g. executing, by the processor, the Boolean query on the plurality of production documents in the production data.

29. The method of claim 28, wherein the at least one salient token comprises a plurality of salient tokens and wherein the step of generating the Boolean query for the cluster in the plurality of clusters further comprises the steps of:
   h. calculating a salient token/cluster weight matrix for the plurality of salient tokens for the cluster;
   i. ranking the plurality of salient tokens for the cluster according to the matrix; and
   j. selecting a list of the top N salient tokens from the ranked plurality of salient tokens for the cluster, where N is a positive integer.

30. The method of claim 29, wherein generating the Boolean query further comprising the steps of:
   k. setting a clause to an empty clause;
   l. selecting a next best salient token from the top N salient tokens;
   m. determining whether a recall improvement is greater than a minimum improvement;
   n. responsive to the recall improvement not being greater than the minimum improvement, going to step (w);
   o. responsive to the recall improvement being greater than the minimum improvement, setting the clause equal to the selected next best salient token;
   p. selecting the next best salient token from the top N salient tokens;
   q. determining whether a precision improvement is greater than a recall drop;
   r. responsive to the precision improvement not being greater than the recall drop, going to step (v);
   s. responsive to the precision improvement being greater than the recall drop, setting the clause to the clause ANDed with the selected next best salient token;
   t. determining whether a number of clause tokens is less than a maximum number of clause tokens;
   u. responsive to the number of clause tokens being less than the maximum number of clause tokens, going to step (p);
   v. responsive to the number of clause tokens not being less than the maximum number of clause tokens, setting the query equal to the query ORed with the clause;
   w. determining whether a number of clauses is less than a maximum number of clauses;
   x. responsive to the number of clauses being less than the maximum number of clauses, going to step (k); and
   y. responsive to the number of clauses not being less than the maximum number of clauses, going to step (f).

31. The method of claim 29, wherein generating the Boolean query further comprises the steps of:
   k. selecting a next best positive salient token from the top N salient tokens;
   l. determining if whether a recall improvement is greater than a minimum improvement;
   m. responsive to the recall improvement not being greater than the minimum improvement, going to step (o);
   n. responsive to the recall improvement being greater than the minimum improvement, setting a query equal to the query ORed with the selected next best positive salient token;
   o. determining whether a number of OR tokens is less than a maximum number of OR tokens;
   p. responsive to the number of OR tokens being less than the maximum number of OR tokens, going to step (k);
   q. responsive to the number of OR tokens not being less than the maximum number of OR tokens, selecting a next best negative salient token from the top N salient tokens;
   r. determining whether a precision improvement is greater than a recall drop;
   s. responsive to the precision improvement not being greater than the recall drop, going to step (u);
   t. responsive to the precision improvement being greater than the recall drop, setting the query equal to the query ANDed with the selected next best negative salient token;
   u. determining whether a number of AND NOT tokens is less than a maximum number of AND NOT tokens;
   v. responsive to the number of AND NOT tokens being less than the maximum number of AND NOT tokens, going to step (q); and
   w. responsive to the number of AND NOT tokens not being less than the maximum number of AND NOT tokens, going to step (f).

32. The method of claim 28, further comprising the steps of:
   h. analyzing results from the Boolean query;
   i. determining whether there is new training data;
   j. responsive to there being new training data, going to step (a);

k. responsive to there not being new training data, determining if whether the Boolean query has been modified;

l. responsive to the Boolean query being modified, going to step (g);

m. responsive to the Boolean query not being a modified, determining if there is a change in the number of clusters;

n. responsive to there being a change in the number of clusters, going to step (d);

o. responsive to there not being a change in the number of clusters, determining if whether there is new production data, or whether there is new production data and the Boolean query has been modified;

p. responsive to there being new production data, or there being new production data and the Boolean query has been modified, going to step (f); and q. responsive to there not being new production data or there not being new production data and the Boolean query has not been modified, being done.

33. The method of claim 28, further comprising the steps of:

h. getting a second production data, wherein the second production data comprises a plurality of second production documents and wherein each of the plurality of second production documents comprises a second production token; and i. executing the Boolean query on the plurality of second production documents in the second production data.

34. The method of claim 28, wherein clustering the training data is accomplished by an algorithm selected from the group comprising: a k-means, a bisecting k-means, an agglomerative, and a divisive hierarchical.

35. The method of claim 28, wherein the plurality of training documents and/or the plurality of production documents comprises one item selected from the group comprising: a document, an email, a content of a website, a content of a blog, a transcript of a voice call, an identifiable item from a video, an identifiable item from a picture, a transcript of a conversation, a document containing different languages, and a transcript of an audio portion of a video.

36. The method of claim 28, wherein the salient token is an item selected from the group comprising: a word, a part of a word, a phrase, a bi-gram, and a tri-gram.

37. A processor based apparatus for performing the method of one of claims 19, 22, 23, 31, 32, 33 and 34-36.

38. An apparatus for generating a Boolean query comprising:

a memory coupled to a processor configuring:

a. means for getting training data, wherein the training data comprises a plurality of training documents and wherein each of the plurality of training documents comprises at least one training token;

b. means for clustering the plurality of training documents into a plurality of clusters based on the at least one training token in the plurality of training documents, wherein each cluster comprises at least one training document;

c. means for generating the Boolean query for a cluster in the plurality of clusters based on an occurrence of the at least one training token in the at least one training document in the plurality of training documents;

d. means for getting production data, wherein the production data comprises a plurality of production documents and wherein each of the plurality of production documents comprises at least one production token; and e. means for executing the Boolean query on the plurality of production documents in the production data.

39. An apparatus for generating a Boolean query:

a memory coupled to a processor configuring:

a. means for getting training data, wherein the training data comprises a plurality of training documents and wherein each of the plurality of training documents comprises at least one training token;

b. means for cleaning the training data;

c. means for identifying at least one salient token from the at least one training token in each of the plurality of training documents;

d. means for clustering the plurality of training documents into a plurality of clusters based on the at least one training token in the plurality of training documents or the at least one salient token, wherein each cluster comprises at least one training document;

e. means for generating the Boolean query for a cluster in the plurality of clusters based on an occurrence of the at least one salient token in the at least one training document in the plurality of training documents;

f. means for getting production data, wherein the production data comprises a plurality of production documents and wherein each of the plurality of production documents comprises at least one production token; and g. means for executing the Boolean query on the plurality of production documents in the production data.

40. A system for generating a Boolean query comprising:

a. a processor;

b. a memory coupled to the processor;

c. a data manager configured to get training data and production data, wherein the training data comprises a plurality of training documents and each of the plurality of training documents comprises at least one training token, wherein the production data comprises a plurality of production documents and each of the plurality of production documents comprises at least one production token, and wherein the data manager is configured to clean the training data, identify a plurality of salient tokens from the at least one training token in each of the plurality of training documents, calculate a salient token/cluster weight matrix for the plurality of salient tokens for the cluster, to rank the plurality of salient tokens for the cluster, and to select a list of the top N salient tokens from the plurality of training tokens for the cluster;

d. a clustering manager configured to cluster the plurality of training documents into a plurality of clusters based on the at least one training token in the plurality of training documents, wherein each cluster comprises at least one training document; and e. a query manager configured to generate the Boolean query for a cluster in the plurality of clusters based on an occurrence of the plurality of salient tokens in the at least one training document in the plurality of training documents, and to execute the Boolean query on the plurality of production documents in the production data.

41. A computer implemented method for generating a Boolean query comprising:

in a data manager:

a. getting training data, wherein the training data comprises a plurality of training documents and wherein each of the plurality of training documents comprises at least one training token;

b. cleaning the training data;

c. identifying, by a processor, a plurality of salient tokens from the at least one training token in each of the plurality of training documents;

in a query manager:

d. clustering the plurality of training documents into a plurality of clusters based on the at least one training token in the plurality of training documents, wherein each cluster comprises at least one training document;
e. calculating a salient token/cluster weight matrix for the plurality of salient tokens for the cluster;
k. ranking the plurality of salient tokens for the cluster; and
l. selecting a list of the top N salient tokens from the plurality of salient tokens for the cluster;

in a query manager:

m. generating, by the processor, the Boolean query for a cluster of the plurality of clusters based on an occurrence of the plurality of salient tokens in the at least one training document in the plurality of training documents;
n. getting production data, wherein the production data comprises a plurality of production documents and wherein each of the plurality of production documents comprises at least one production token; and
o. executing, by the processor, the Boolean query on the plurality of production documents in the production data.

* * * * *